United States Patent
Sun et al.

(10) Patent No.: US 6,509,269 B2
(45) Date of Patent: *Jan. 21, 2003

(54) ELIMINATION OF PAD GLAZING FOR AL CMP

(75) Inventors: Lizhong Sun, Sunnyvale, CA (US); Shijian Li, Santa Clara, CA (US); Fred C. Redeker, Fremont, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,452

(22) Filed: Oct. 19, 1999

(65) Prior Publication Data

US 2001/0031558 A1 Oct. 18, 2001

(51) Int. Cl.$^7$ ............................................. H01L 21/302
(52) U.S. Cl. ..................... 438/690; 438/691; 438/692; 438/693; 438/657
(58) Field of Search ................. 438/690, 691, 438/692, 693, 697; 252/79.1

(56) References Cited

U.S. PATENT DOCUMENTS

| | | | |
|---|---|---|---|
| 5,527,423 A | * 6/1996 | Neville et al. | 438/693 |
| 5,626,509 A | * 5/1997 | Hayashi | 451/285 |
| 5,645,682 A | 7/1997 | Skrovan | 438/692 |
| 5,704,987 A | 1/1998 | Huynh et al. | 134/6 |
| 5,709,588 A | 1/1998 | Muroyama | 451/41 |
| 5,752,875 A | 5/1998 | Ronay | 451/41 |
| 5,775,983 A | 7/1998 | Shendon et al. | 451/444 |
| 5,858,813 A | 1/1999 | Scherber et al. | 438/653 |
| 5,866,031 A | * 2/1999 | Carpio et al. | 252/79.1 |
| 5,913,715 A | * 6/1999 | Kirchner et al. | 451/56 |
| 5,934,980 A | * 8/1999 | Koos et al. | 451/41 |
| 5,957,757 A | * 9/1999 | Berman | 451/56 |
| 6,033,596 A | * 3/2000 | Kaufman et al. | 252/79.1 |

* cited by examiner

Primary Examiner—Robert Kunemund
Assistant Examiner—Binh X. Tran
(74) Attorney, Agent, or Firm—Moser, Patterson & Sheridan

(57) ABSTRACT

Polishing pad glazing during CMP of Al and Al alloys is eliminated or substantially reduced by utilizing a neutral polishing slurry containing a sufficient amount of a surfactant to prevent agglomeration of the abrasive particles with polishing by-products. Embodiments include CMP an Al or an Al alloy surface employing a slurry containing abrasive $Al_2O_3$ particles and about 0.02 to about 5 wt. % of a surfactant to prevent $Al_2O_3$ abrasive slurry particles from agglomerating with $Al(OH)_3$ polishing by-products. Embodiments further include subsequent ex situ pad conditioning using an acid or base to dissolve, or a complexing agent to remove, $Al(OH)_3$ polishing by-products.

25 Claims, No Drawings

ELIMINATION OF PAD GLAZING FOR AL CMP

TECHNICAL FIELD

The present invention relates to aluminum (Al) and/or Al alloy metalization in semiconductor devices with improved planarity. The present invention is applicable to chemical mechanical polishing (CMP) Al and Al alloy surfaces in manufacturing high-speed integrated circuits.

BACKGROUND ART

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconducted "chips" comprising five or more levels of metalization are becoming more prevalent as device geometries shrink into the deep submicron level.

In manufacturing multi-layer semiconductor devices, a metal layer, such as Al or an Al alloy, is deposited into an opening in a dielectric interlayer and the surface planarized, as by CMP, to obtain a substantially planar surface. In conventional CMP techniques, a wafer carrier assembly is rotated in contact with a polishing pad in a CMP apparatus. The polishing pad is mounted on a rotating turntable or platen or moving above a stationary polishing table driven by an external driving force. The wafers are typically mounted on a carrier or polishing head which provides a controllable pressure urging the wafers against the rotating or linearly moving polishing pad. The CMP apparatus effects polishing or rubbing movement between the surface of each thin semiconductor wafer and the polishing pad while dispensing a polishing slurry containing abrasive particles in a reactive solution to effect both chemical activity and mechanical activity while applying a force between the wafer and the polishing head.

Conventional polishing pads employed in abrasive slurry processing typically comprise a grooved porous polymeric surface, such as polyeurathane, and the abrasive slurry varied in accordance with the particular material undergoing CMP. Basically, the abrasive slurry is impregnated into the pores of the polymeric surface while the grooves convey the abrasive slurry to the wafer undergoing CMP. Typically CMP is performed not only on a silicon wafer itself, but on various dielectric layers, such as the silicon oxide, conductive layers, such as Al and copper, or a layer containing both conductive and dielectric materials, as in damascene processing.

As the drive for miniaturization proceeds apace, it becomes increasingly critical to obtain surfaces with a high degree of planarity to avoid challenging the depth of focus limitations of conventional photolithographic techniques, particularly with respect to achieving submicron dimensions, such as below about 0.25 micron. During the CMP polishing process, however, the polishing surface of the polishing pad undergoes changes. Such changes are believed to be caused by, inter alia, spent slurry accumulating in the pores of the polishing pad and the compression of the surface of the polishing pad due to the loading of the substrate against the pad. The accumulation of spent slurry in the porous polishing surface in combination with the compression of the pad surface creates a "glazed" condition on the pad. A glazed pad typically has a lower coefficient of friction and, hence, exhibits a substantially lower material removal rate than that of a fresh or un-glazed polishing pad. When the removal rate of the polishing pad is reduced, the time required to polish a substrate increases, thereby reducing production throughput. A key factor in achieving consistent polishing of substrates is the condition of the surface of the polishing pad. In addition, a glazed pad surface causes scratching on the wafer surface. Accordingly, conventional practices comprise conditioning a conventional polishing pad, such as model IC1000 or SuboIV of a woven polyeurathane material available from Rodel Company, Newark, Del., using a conditioning tool. See, for example, Shendon et. al., U.S. Pat. No. 5,775,983. Scrovan in U.S. Pat. No. 5,645,682 discloses the use of a conditioning solution which is dispensed onto the planarizing surface while a semiconductor wafer is planarized. A conventional polishing slurry is disclosed by Scherber et. al. in U.S. Pat. No. 5,858,813, which slurry is designed for polishing silicon dioxide and comprises a surfactant. Huynh et. al. in U.S. Pat. No. 5,704,987 disclose a basic polishing solution containing a non-ionic polymeric surfactant. Muroyama in U.S. Pat. No. 5,709,588 discloses a basic polishing slurry for silicon dioxide which comprises at least a carboxyl group containing material, an amino group containing material and a sulfonic acid group containing material.

Pad glazing during CMP of Al and Al alloys poses a severe impediment to production throughput. For example, every minute of CMP for Al and Al alloys requires two minutes of pad conditioning to remove pad glazing. Such pad conditioning has typically been conducted by employing a megasonic pad rinse and ex-situ treatment with a diamond disk. In addition to consuming a large amount of time, megasonic nozzles are quite expensive.

There exists a need for methodology enabling the planarization of Al and/or Al alloys using CMP with reduced pad glazing. There exists a particular need for methodology enabling CMP of Al and/or Al alloys at high production throughput by eliminating or substantially reducing pad glazing.

SUMMARY OF THE INVENTION

An advantage of the present invention is a method of planarizing Al and Al alloys by CMP at high production throughput with no or significantly reduced pad glazing.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of planarizing an Al or Al alloy surface, the method comprising CMP the surface with a polishing pad employing a substantially neutral pH slurry containing alumina abrasive ($Al_2O_3$) particles and a surfactant in an amount sufficient to prevent the $Al_2O_3$ particles from agglomerating with aluminum hydroxide ($Al(OH)_3$)-containing CMP by-products.

Embodiments of the present invention further comprise ex situ conditioning the polishing pad surface by treating the polishing pad surface with a chemical to dissolve or bind with and remove $Al(OH)_3$—containing CMP by-products. Embodiments of the present invention comprise CMP with a slurry containing about 0.02 to about 5 wt. % of a non-ionic surfactant and ex situ polishing pad conditioning employing a chemical agent comprising deionized water and an acid, such as sulfuric acid, a base, such as potassium hydroxide, or a complexing agent capable of binding with $Al(OH)_3$.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the description is to be regarded as illustrative in nature, and not as restrictive.

DESCRIPTION OF THE INVENTION

The present invention addresses and solves the pad glazing problem attendant upon CMP Al and/or Al alloys. As used throughout this disclosure, the symbol Al is intended to encompass high purity elemental aluminum as well as aluminum-based alloys, e.g., aluminum alloys containing at least about 80% aluminum. As also used throughout this disclosure, the expression "in situ" conditioning is intended to encompass polishing pad conditioning conducted during CMP of a wafer, while the expression "ex situ" conditioning is intended to encompass polishing pad conditioning conducted separately from CMP of a wafer.

Conventional practices in manufacturing semiconductor devices comprise CMP a deposited layer of Al, as when forming an Al conductive pattern by a damascene technique. Pad glazing adversely impacts the uniformity and polishing rate of CMP. Accordingly, pad conditioning is required, as by in situ conditioning or by ex situ conditioning with a megasonic pad rinse and diamond disk thereby adversely impacting production throughput in that such polishing pad conditioning requires two minutes for every one minute of CMP. Research and experimentation was conducted to gain insight as to operative pad glazing mechanisms to enable formulating measures to prevent Al pad glazing rather than address the Al pad glazing problem by remedial action. Upon conducting such experimentation and investigation, it was found that CMP of Al generates a polishing by-product containing $Al(OH)_3$, a gelatin-like material. Since Al can dissolve in both acidic and basic solutions, the Al CMP slurry is substantially at a neutral pH. However, $Al(OH)_3$ does not dissolve in a neutral pH. Abrasive particles of $Al_2O_3$ are typically negatively charged and, hence, attract $Al^{+++}$, $Al(OH)_2^{++}$, and $Al(OH)_2^+$, causing precipitation. The precipitation of gelatin-like $Al(OH)_3$ with $Al_2O_3$ is believed to cause pad glazing.

Having gained insight as to the mechanism of pad glazing when CMP Al, further studies were conducted to determine methods for preventing or significantly reducing precipitation of $Al(OH)_3$ with $Al_2O_3$ thereby preventing or significantly reducing pad glazing. In accordance with embodiments of the present invention, pad glazing during CMP of Al is prevented or significantly reduced by employing a CMP slurry containing a sufficient amount of a surfactant, such as a non-ionic surfactant, to prevent $Al_2O_3$ abrasive particles of the CMP slurry from agglomerating with $Al(OH)_3$ CMP by-products. In other words, having discovered that the source of the pad glazing problem attendant upon CMP Al is agglomeration of $Al_2O_3$ and $Al(OH)_3$ it was found that such pad glazing can be prevented or significantly reduced by preventing or significantly reducing such agglomeration. It was found particularly effective to employ a polishing pad slurry containing a non-ionic surfactant in amount sufficient to alter the surface charge of the $Al_2O_3$ abrasive particles to prevent agglomeration with $Al(OH)_3$.

Given the present disclosure and objectives, the appropriate amount and type of surfactant can be determined in a particular situation. For example, it was found that an abrasive slurry containing about 0.02 to about 5% by wt., e.g. about 1 to about 2% by wt., of a non-ionic surfactant, such as ethoxylated alcohols, glycerol esters, or alkanol amides, effectively eliminated or substantially reduced polishing pad glazing during CMP of Al. Embodiments of the present invention comprise CMP of Al employing a polishing pad slurry comprising about 1 to about 10 wt. %, e.g., about 3 to about 5 wt. % abrasive $Al_2O_3$ particles, as having a particle size of about 200 to about 300 nanometers, about 1 to about 5 wt. %, .e.g., about 2 to about 3 wt. % of an oxidizing agent, such as hydrogen peroxide, about 0.02 to about 5 wt. %, e.g., about 1 to about 2 wt. % of a non-ionic surfactant, such as ethoxylated alcohols, glycerol esters or alkanol amides, the remainder deionized water.

It was also found that polishing pad glazing attendant upon CMP of Al can be substantially reduced by conditioning the polishing pad, ex situ, to remove $Al(OH)_3$ CMP by-products. Accordingly, embodiments of the present invention comprise ex situ pad conditioning using a chemical agent comprising deionized water and an acid or a base to dissolve such $Al(OH)_3$ polishing by-products, or a complexing agent capable of binding with the $Al(OH)_3$ polishing by-products for removal, as by water rinsing. Such a chemical agent can comprise distilled water and up to about 5 wt. %, e.g. about 1 to about 2 wt. %, of the acid, base or complexing agent. It was found particularly suitable to employ sulfuric acid as the acid and potassium hydroxide as the base. Suitable compexing agents include oxalates, dicarboxylates, e.g., oxalates, manolates, succinates and maleonates. The chemical agent for ex situ pad conditioning can have a pH of about 1 to about 5 when employing an acid, a pH of about 9 to about 13 when employing a base, or can have a neutral pH of about 7 when employing a complexing agent.

In accordance with embodiments of the present invention, polishing pad glazing during CMP of Al is eliminated or substantially reduced employing a polishing slurry containing a sufficient amount of a surfactant to prevent agglomeration of abrasive $Al_2O_3$ particles and $Al(OH)_3$-containing CMP by-products. In addition, polishing pad glazing is further reduced by ex situ conditioning of the polishing pad employing an acid or base to dissolve $Al(OH)_3$ or a complexing agent to bind with $Al(OH)_3$ and removal thereof from the polishing pad surface. The present invention, therefore, improves CMP of Al by achieving high wafer-to-wafer uniformity, thereby reducing scratching, improving surface planarity, and significantly increasing production throughput. The present invention is applicable to the manufacture of various types of semiconducted devices during various planarizing phases when CMP is conducted. The present invention enjoys particular applicability in manufacturing high-density semiconducted devices with features in the deep submicron range.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of planarizing an aluminum (Al) or Al alloy surface, the method comprising:

chemical mechanical polishing (CMP) the surface with a polishing pad employing a slurry having a substantially neutral pH and containing abrasive alumina ($Al_2O_3$) particles and a surfactant in an amount sufficient to prevent the $Al_2O_3$ particles from agglomerating with aluminum hydroxide ($Al(OH)_3$)-containing CMP by-products; and conditioning a polishing pad surface by treating the polishing pad surface with a chemical agent consisting essentially of a complexing agent capable of binding with ($Al(OH)_3$)-containing CMP by-products.

2. The method according to claim 1, wherein the polishing pad surface is conditioned ex situ.

3. The method according to claim 1, wherein the chemical agent has a pH of about 7.

4. The method according to claim 1, wherein the slurry comprises about 0.02 wt. % to about 5 wt. % of the surfactant.

5. The method according to claim 1, wherein the slurry comprises about 1 wt. % to about 2 wt. % of the surfactant.

6. The method according to claim 1, wherein the surfactant is a non-ionic surfactant.

7. The method according to claim 6, wherein the slurry comprises:

about 1 wt. % to about 10 wt. % $Al_2O_3$;

about 1 wt. % to about 5 wt. % oxidizing agent;

about 0.02 wt. % to about 5 wt. % non-ionic surfactant; and the remainder deionized water.

8. The method according to claim 7, wherein the slurry comprises;

about 3 wt. % to about 5 wt. % $Al_2O_3$;

about 2 wt. % to about 3 wt. % of oxidizing agent;

about 1 wt. % to about 2 wt. % non-ionic surfactant; and the remainder deionized water.

9. The method according to claim 1, wherein the chemical agent further comprises an acid or base capable of dissolving $Al(OH)_3$ or ($Al(OH)_3$)-containing CMP by-products and deionized water.

10. The method according to claim 9, wherein the complexing agent comprises a dicarboxylate.

11. The method according to claim 9, wherein the chemical agent comprises sulfuric acid.

12. The method according to claim 9, wherein the chemical agent comprises potassium hydroxide.

13. The method according to claim 9, wherein the chemical agent has a pH of about 1 to about 5 when comprising an acid or a pH of about 9 to about 13 when comprising a base.

14. The method of claim 9, wherein the complexing agent is selected from the group consisting of oxalates, dicarboxylates, manolates, succinates, maleonates, and combinations thereof.

15. The method according to claim 9, wherein the chemical agent comprises up to about 5 wt. % of the complexing agent.

16. The method according to claim 15, wherein the chemical agent comprises about 1 wt. % to about 2 wt. % of the complexing agent.

17. A method of processing a polishing pad to remove polishing pad glazing, comprising treating a polishing pad surface with a chemical agent consisting essentially of a complexing agent capable of binding with ($Al(OH)_3$)-containing CMP by-products.

18. The method of claim 17, wherein the chemical agent has a pH of about 7 when employing a complexing agent.

19. The method of claim 17, wherein the complexing agent is selected from the group consisting of oxalates, dicarboxylates, manolates, succinates, maleonates, and combinations thereof.

20. The method according to claim 17, wherein the chemical agent further comprises an acid or base capable of dissolving $Al(OH)_3$ or ($Al(OH)_3$)-containing CMP by-products and deionized water.

21. The method according to claim 20, wherein the chemical agent has a pH of about 1 to about 5 when comprising an acid or a pH of about 9 to about 13 when comprising a base.

22. The method according to claim 17, wherein the chemical agent comprises up to about 5 wt. % of the complexing agent.

23. The method according to claim 22, wherein the chemical agent comprises about 1 wt. % to about 2 wt. % of the complexing agent.

24. A method of planarizing an aluminum (Al) or Al alloy surface, the method comprising:

chemical mechanical polishing (CMP) the surface with a polishing pad employing a slurry having a substantially neutral pH and containing abrasive alumina ($Al_2O_3$) particles and a surfactant in an amount sufficient to prevent the $Al_2O_3$ particles from agglomerating with aluminum hydroxide ($Al(OH)_3$)-containing CMP by-products; and conditioning a polishing pad surface by treating the polishing pad surface with a chemical agent consisting essentially of a complexing agent capable of binding with ($Al(OH)_3$)-containing CMP by-products, an acid or base capable of dissolving $Al(OH)_3$ or ($Al(OH)_3$)-containing CMP by-products, and deionized water.

25. A method of processing a polishing pad to remove polishing pad glazing, comprising treating a polishing pad surface with a chemical agent consisting essentially of a complexing agent capable of binding with ($Al(OH)_3$)-containing CMP by-products, an acid or base capable of dissolving $Al(OH)_3$ or ($Al(OH)_3$)-containing CMP by-products, and deionized water.

* * * * *